United States Patent [19]

Aotani et al.

[11] 4,356,247

[45] Oct. 26, 1982

[54] LIGHT-SENSITIVE COMPOSITIONS

[75] Inventors: Yoshimasa Aotani; Teruo Kojima, both of Minami-ashigara; Eiji Nakakita, Kanagawa, all of Japan

[73] Assignee: Fuji Photo Film Co., Ltd., Kanagawa, Japan

[21] Appl. No.: 200,653

[22] Filed: Oct. 27, 1980

[30] Foreign Application Priority Data

Oct. 29, 1979 [JP] Japan ............................ 54-139474

[51] Int. Cl.³ ............................................. G03C 1/71
[52] U.S. Cl. ................................... 430/195; 430/196; 430/285; 430/286; 430/287; 430/919; 430/920; 430/926; 430/927; 430/197
[58] Field of Search ............... 430/196, 195, 287, 286, 430/285, 927, 926, 919, 920, 197

[56] References Cited

U.S. PATENT DOCUMENTS

| | | | |
|---|---|---|---|
| 2,732,301 | 1/1956 | Robertson et al. | 430/287 |
| 3,563,749 | 2/1971 | Munder et al. | 430/920 |
| 3,650,756 | 3/1972 | Ohlschlager | 430/287 |
| 3,699,025 | 10/1972 | Jenkins et al. | 430/927 |
| 3,813,245 | 5/1974 | Laridon et al. | 430/335 |
| 3,945,831 | 3/1976 | Satomura | 430/926 |
| 4,033,773 | 7/1977 | Lewis et al. | 430/926 |
| 4,062,686 | 12/1977 | Van Allan et al. | 430/287 |
| 4,148,658 | 4/1979 | Kondoh et al. | 430/287 |
| 4,282,309 | 8/1981 | Laridon et al. | 430/287 |

FOREIGN PATENT DOCUMENTS 7115311 12/1972 France ............................ 430/926

OTHER PUBLICATIONS

Langford, J. F., et al., *Research Disclosure*, 3/1977, #15568.

*Primary Examiner*—Charles L. Bowers, Jr.
*Attorney, Agent, or Firm*—Sughrue, Mion, Zinn, Macpeak & Seas

[57] ABSTRACT

A light-sensitive composition particularly suitable for making light-sensitive lithographic printing plates is described composed of a mixture of a sensitizer and a photo-crosslinkable polymer, or a mixture of a sensitizer, a compound including a light-sensitive azido group and a polymer reactive with a decomposate of azido groups to be formed upon exposure to light, and a sensitizer represented by the formula (I)

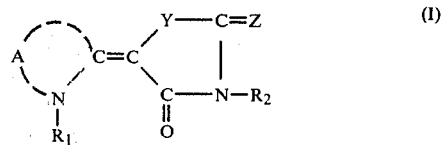

wherein A represents a non-metallic atomic group necessary for forming a heterocyclic ring containing nitrogen; $R_1$ represents an alkyl group or a substituted alkyl group; $R_2$ represents hydrogen, an alkyl group, a substituted alkyl group, an aryl group, or a substituted aryl group; and Y and Z each represents an oxygen atom or a sulfur atom.

9 Claims, No Drawings

LIGHT-SENSITIVE COMPOSITIONS

BACKGROUND OF THE INVENTION

1. Field of the Invention

This invention relates to light-sensitive compositions, and more particularly to light-sensitive compositions comprising a mixture of a sensitizer and a photo-crosslinkable polymer or a mixture of a sensitizer, compound including a light-sensitive azido group and a polymer reactive with a decomposate of azido groups to be formed upon exposure to light. The light-sensitive compositions of this invention are particularly useful for light-sensitive layers of light-sensitive or presensitized printing plates, photoresists, etc.

2. Description of the Prior Art

In the field of photography methods are known wherein an image is reproduced in a radiation-sensitive material by changing some physical property of the light-sensitive layer of the radiation-sensitive material at the exposed portions. Among the materials for the radiation-sensitive materials used in such methods are photo-hardenable materials such as a polymer which, upon exposure to actinic light, is insolubilized or hardened. The difference in physical properties between the exposed portions and the unexposed portions can be utilized for forming images by the application of, e.g., mechanical pressure, heat, solvent, etc., depending upon the particular differences in physical properties. For example, by treating the layer of an image-exposed radiation-crosslinkable material with a solvent, the unhardened material of the unexposed portion of the layer is removed to leave an image of a hardened polymer. Such a method has been used for producing lithographic printing plates, photoresists, printed photographic images, etc.

However, since the speed of a photo-crosslinkable material is relatively low, it has been desired to increase the speed of the photo-insolubilizing reaction. For this purpose, a large number of compounds have been proposed as sensitizers. For example, 2-benzoylmethylene-3-methyl[1,2-d]naphthothiazoline (BNTZ) described in U.S. Pat. No. 2,732,301 is useful as a sensitizer for light-sensitive compositions. However, BNTZ possesses a drawback in that it is liable to be crystallized in a light-sensitive layer. More particularly, BNTZ is assimilated in a light-sensitive layer in an amount of only limited range. Furthermore, even though a transparent light-sensitive layer containing BNTZ may be obtained initially, when the light-sensitive material is preserved under non-ideal conditions such as the temperature higher than room temperature (e.g., higher than 30° C.) and the humidity higher than usual (e.g., higher than 70% RH), crystals of BNTZ form in the light-sensitive layer, thus greatly reducing the quality of the light-sensitive layer. That is, the relative proportion of the molecules of the sensitizer increases at the surface of the light-sensitive layer, and hence the crosslinking of the layer occurs insufficiently at the deep portion. Consequently, it has been desired to provide a sensitizer which shows a low photo-insolubilizing reaction rate and does not crystallize in a light-sensitive layer during preservation.

SUMMARY OF THE INVENTION

The object of this invention is, therefore, to provide a highly sensitive light-sensitive composition containing a sensitizer which does not crystallize in the light-sensitive layer during preservation.

As a result of various investigations to attain the above-described object of this invention, the inventors have discovered a specific sensitizer that greatly increases the photo-insolubilizing reaction rate of a photo-crosslinkable polymer or of a mixture of compound having a light-sensitive azido group and a polymer reactive with a decomposate of azido groups to be formed upon exposure to light, and which does not crystallize in the light-sensitive layer during storage.

Particularly, the above-described object of this invention can be attained by the use of a light-sensitive composition comprising a mixture of a photo-crosslinkable polymer, or compound having a light-sensitive azido group and a polymer reactive with a decomposate of azido groups to be formed upon exposure to light, and a sensitizer represented by the formula (I)

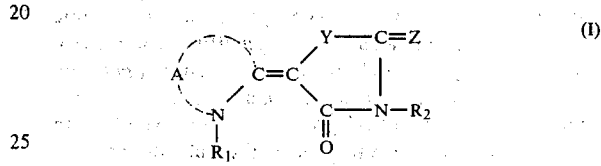

wherein A represents a non-metallic group necessary for forming a heterocyclic ring containing nitrogen; $R_1$ represents an alkyl group or a substituted alkyl group; $R_2$ represents hydrogen, an alkyl group, a substituted alkyl group, an aryl group, or a substituted aryl group; and Y and Z each represents an oxygen atom or a sulfur atom.

DETAILED DESCRIPTION OF THE INVENTION

In general formula (I), A is a non-metallic group of atoms necessary for forming a nitrogen-containing heterocyclic ring (together with the nitrogen on carbon atoms to which it is linked, as shown in formula (I)) of the type usually present in cyanine dyes. Examples of such non-metallic groups are benzothiazoles (e.g., benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole, 5,6-dimethoxybenzothiazole, etc.), naphthothiazoles (e.g., α-naphthothiazole, β-naphthothiazole, etc.), benzoselenazoles (e.g., benzoselenazole, 5-chlorobenzoselenazole, 6-methylbenzoselenazole, 6-methoxybenzoselenazole, etc.), naphthoselenazoles (e.g., α-naphthoselenazole, β-naphthoselenazole, etc.), benzoxazoles (e.g., benzoxazole, 5-methylbenzoxazole, 5-methoxybenzoxazole, 5-phenylbenzoxazole, 6-methoxybenzoxazole, 5,6-dimethylbenzoxazole, etc.), and naphthoxazoles (e.g., α-naphthoxazole, β-naphthoxazole, etc.).

$R_1$ in formula (I) is an alkyl group of the type usually present in cyanie dyes (preferably a straight chain or branched chain alkyl group having from 1 to 6 carbon atoms, and more preferably a straight chain or branched chain alkyl group having from 1 to 3 carbon atoms, such as a methyl group, an ethyl group, a propyl group, an isopropyl group, etc.) or a similar substituted alkyl group (examples of the substituent are a hydroxy group, a carboxy group, an alkoxycarbonyl group, an aryl group, an alkenyl group, etc.), such as a 2-hydroxyethyl group, a 2-methoxyethyl group, a carboxymethyl group, a 2-carboxyethyl group, a 3-carboxypropyl group, a 2-carbomethoxyethyl group, a benzyl group, a phenethyl group, a p-carboxyphenethyl group, a vinylmethyl group, etc.

$R_2$ in the formula is hydrogen, an alkyl group (preferably a straight chain or branched chain alkyl group having from 1 to 16 carbon atoms, and more preferably a straight chain or branched chain alkyl group having from 1 to 8 carbon atoms, such as a methyl group, an ethyl group, a propyl group, an isopropyl group, a hexyl group, a 2-ethylhexyl group, etc.), a similar substituted alkyl group (examples of the substituent are a hydroxy group, an alkoxy group, a carboxy group, an alkoxycarbonyl group, an aryl group, an alkenyl group, etc.), such as, for example, a 2-hydroxyethyl group, a 2-methoxyethyl group, a carboxymethyl group, a 2-carboxyethyl group, a 3-carboxypropyl group, a carbomethoxymethyl group, a carboethoxymethyl group, a benzyl group, a phenethyl group, a p-carboxyphenethyl group, a vinylmethyl group, etc.), an aryl group (e.g., a phenyl group, a naphthyl group, etc.), or a similar substituted aryl group (examples of the substituent are a hydroxy group, an alkoxy group, a carboxy group, a halogen atom, etc.), such as, for example, a p-methylphenyl group, a p-methoxyphenyl group, a p-carboxyphenyl group, an m-carboxyphenyl group, a p-chlorophenyl group, etc.

Y and Z in formula (I) each independently represents an oxygen atom or a sulfur atom.

The sensitizers according to aforesaid formula (I) used in this invention may be prepared according to the method described in L. G. S. Brooker, et al., *Journal of American Chemical Society*, Vol. 73, p. 5326 (1951), the method described in R. A. Jeffreys, et al., *Journal of the Chemical Society*, p. 4632 (1952), or the method described in H. Larive, et al., *Bull. Soc. Chim. France*, p. 1443 (1956). Particularly, they may be prepared by reacting compounds of formula (II) and compounds of formula (III), under basic conditions:

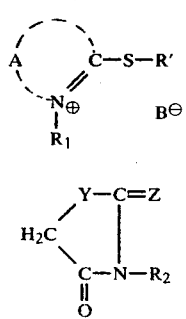

(II)

(III)

wherein A, $R_1$, $R_2$, Y, and Z have the same meanings as in formula (I); R' represents an alkyl group or a substituted alkyl group (e.g., a methyl group, an ethyl group, a vinylmethyl group, etc.); and B⊖ represents an anion (e.g., a chlorine ion, a bromine ion, a p-toluenesulfonate ion, an ethylsulfate ion, a sulfate ion, a perchlorate ion, a thiocyanate ion, etc.).

Typical examples of the sensitizers represented by formula (I) are illustrated below, but the sensitizers useful in this invention are not limited thereto.

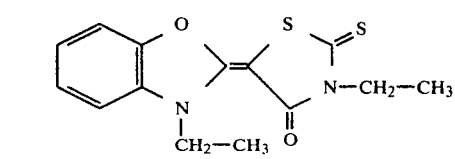

No. 1

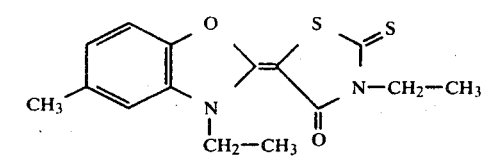

No. 2

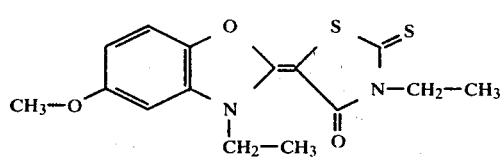

No. 3

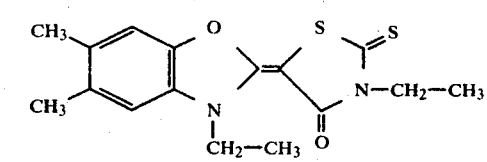

No. 4

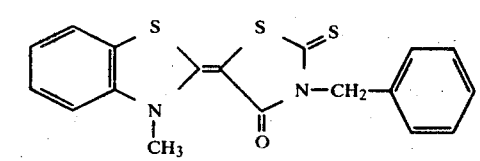

No. 5

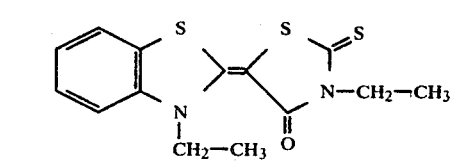

No. 6

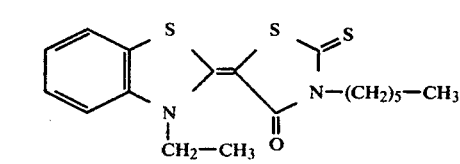

No. 7

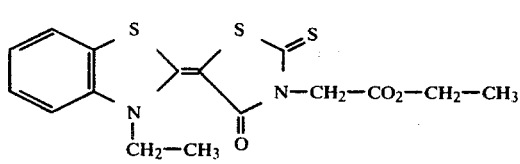

No. 8

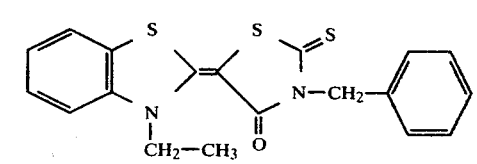

No. 9

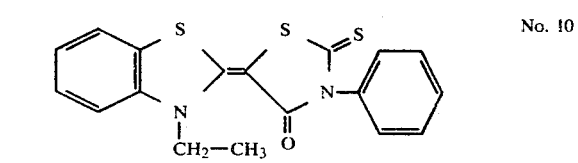

No. 10

-continued

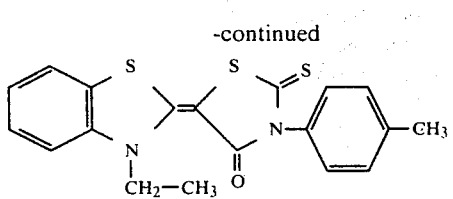

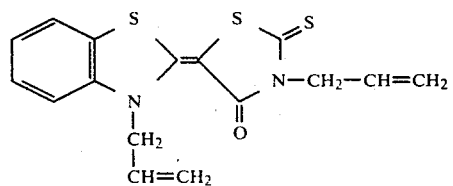

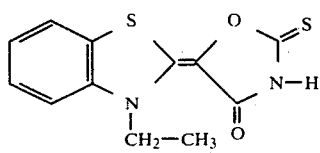

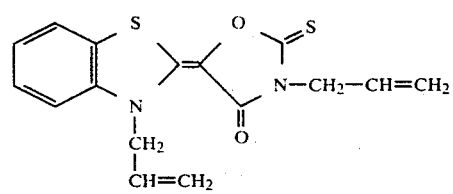

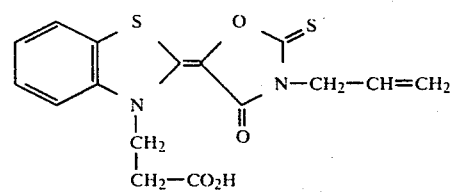

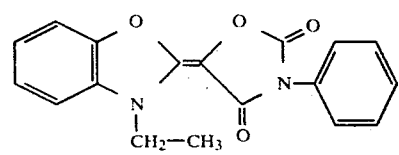

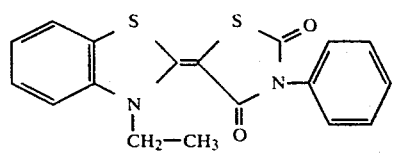

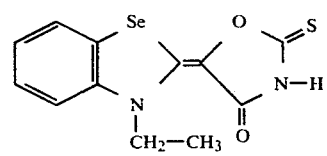

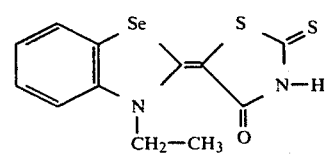

-continued

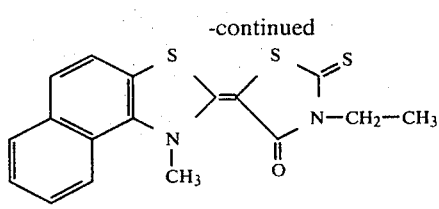

Next, the photo-crosslinkable polymers useful in this invention will be described in more detail. The polymers described above contain polymers having cinnamates, polymers having photo-crosslinkable azido group, etc.

Polymers having photo-crosslinkable unsaturated bonds which can be sensitized by the sensitizers of this invention include, for example, polymers having a polymerization unit having bonded thereto an R—CH═CH—CO— group, (wherein R is a substituted or unsubstituted aryl group such as phenyl, m-nitrophenyl, etc., or a heterocyclic group). Examples of such polymers include the cinnamic acid esters such as the cinnamic acid ester of polyvinyl alcohol, α-phenyl cinnamic acid ester, o-chlorocinnamic acid ester, m-nitrocinnamic acid ester, etc.; the cinnamic acid esters of starch; the cinnamic acid esters of cellulose; the cinnamic acid esters of hydroxyalkyl cellulose; and the cinnamic acid esters of partially alkylated polyvinyl alcohol, as described in U.S. Pat Nos. 2,670,286, 2,690,966, and 2,732,301; the cinnamoylated polystyrene as described in U.S. Pat. No. 2,566,302; the light-sensitive polymers prepared by the ester-exchange reaction between polyvinyl acetate and cinnamic acid esters or cinnamic acid ester derivatives as described in Japanese Patent Publication No. 7666/64; the β-(2-furyl)acrylic acid esters of polyvinyl alcohol as described in Japanese Patent Publication No. 6412/69; the polyesters prepared by condensing polymers having chloromethyl group at the aliphatic side chain and cinnamates as described in Japanese Patent Publication No. 3220/73; the polymers obtained by the homopolymerization or copolymerization of β-cinnamoyloxyethyl methacrylate obtained by the reaction of β-hydroxyethyl methacrylate and cinnamic acid chloride as described in Japanese Patent Publication No. 28122/74; the polymers obtained by the homopolymerization or copolymerization of β-(2-furyl)acryloyloxyethyl methacrylate as described in Japanese Patent Publication No. 11283/75; the polymers of monomer obtained by adding cinnamic acid or β-(2-furyl)acrylic acid to glycidyl methacrylate or glycidyl acrylate and further reacting the addition product and cinnamic acid chloride or β-(2-furyl)acrylic acid chloride as described in Japanese Patent Publication No. 481/76; and the polymers of monomer obtained by adding cinnamic acid or β-(2-furyl)acrylic acid to glycidyl acrylate or glycidyl methacrylate and further adding a cyclic acid anhydride to the addition product, as described in Japanese Patent Publication No. 482/76.

Examples of other polymers having photo-crosslinkable unsaturated bond which can be sensitized by the sensitizers of this invention include polyesters having a —CH═CH—CO— group, polyamides, and polycarbonates. Examples of such polymers include insoluble condensation polymerization products having a light-sensitive group bonded by an ester bond to the main polymer chain, such as the light-sensitive polyester composed of p-phenylenediacrylic acid and diol as described in U.S. Pat. Nos. 3,030,208 and 3,707,373.

Still other examples of photo-crosslinkable materials which can be sensitized by the sensitizers of this invention are shown in U.S. Pat. No. 3,929,489. Examples thereof include the unsaturated polyesters having a recurring unit shown by the structural formula

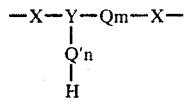

wherein X represents a carbonyl group; n and m are integers the sum of which is 1; Q is defined by the general formula

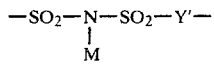

and Q' is defined by the general formula

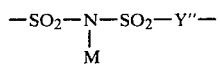

wherein, however, —SO$_2$ is bonded to Y and Y"— is bonded to H; Y represents a trivalent aromatic group; Y' represents a divalent aromatic group; Y" represents a divalent aromatic group or an alkylene group having 1 to 12 carbon atoms; and M represents a solubilizing cation (e.g., an alkali metal ion such as Na$^+$ and K$^+$, an ammonium ion, etc.).

Examples of polymers having photo-crosslinkable azido group which can be sensitized by the sensitizers of this invention include the azido group-containing polymers described in U.S. Pat. No. 3,096,311 and Japanese Patent Publication Nos. 9047/69, 31837/69, 9613/70, 24915/70, and 25713/70.

Light-sensitive azide compounds (exclusive of polymers having photo-crosslinkable azido group described above) useful in this invention include an aromatic azide compound wherein an azido group is bonded to an aromatic ring directly, or through a carbonyl group or a sulfonyl group. Such a compound forms nitrene by the decomposition of the azido group upon exposure to light and is insolubilized by the various reactions of nitrene. Preferred aromatic azide compounds are compounds having one or more groups such as azidophenyl, azidostyryl, azidobenzal, azidobenzoyl, and azidocinnamoyl. Practical examples are 4,4'-diazidochalcone, 4-azido-4'-(4-azidobenzoylethoxy)chalcone, N,N-bis-(p-azidobenzal-p-phenylenediamine, 1,2,6-tri(4'-azidobenzoxy)hexane, 2-azido-3-chloro-benzoquinone, 2,4-diazido-4'-ethoxyazobenzene, 2,6-di(4'-azidobenzal)-4-methylcyclohexanone, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4'-azidobenzal)cyclohexanone, 4,4'-diazidophenylmethane, 1-(4-azidophenyl)-5-furyl-2-penta-2,4-dien-1-one, 1-(4-azidophenyl)-5-(4-methoxyphenyl)penta-1,4-dien-3-one, 1-(4-azidophenyl)-3-(1-naphthyl)propen-1-one, 1-(4-azidophenyl)-3-(4-dimethylaminophenyl)propan-1-one, 1-(4-azidophenyl)-5-phenyl-1,4-pentadien-3-one, 1-(4-azidophenyl)-3-(4-nitrophenyl)-2-propen-1-one, 1-(4-azidophenyl)-3-(2-furyl)-2-propen-1-one, 1,2,6-tri(4'-azidobenzoxy)hexane, 2,6-bis(4-azidobenzylidyn-p-t-butyl)cyclohexanone, 4,4'-diazidodibenzalacetone, 4,4'-diazidostilbene-2,2'-disulfonic acid, 4'-azidobenzalacetophenone-2-sulfonic acid, 4,4'-diazidostilbene-α-carboxylic acid, di(4-azido-2'-hydroxybenzal)acetone-2-sulfonic acid, 4-azidobenzalacetophenone-2-sulfonic acid, 2-azido-1,4-dibenzenesulfonylaminonaphthalene, 4,4'-diazido-stilbene-2,2'-disulfonic acid anilide, etc.

Polymers reactive with a decomposate of azido groups to be formed upon exposure to light as used in this invention include polyvinyl alcohol, polyvinyl pyrrolidone, copolymers thereof, polyacrylonitrile, a copolymer of acrylonitrile and styrene, and tripolymer of acrylonitrile, butadiene, and styrene, polyamide (e.g., 6-nylon, 6,6-nylon, etc.), poly(1,3-butadiene), polyisoprene, cyclized rubber, a novolak type phenol resin, a novolak type denatured phenol resin, a homopolymer or copolymer of 2-hydroxyethylene methacrylate or acrylate, a polymer having a cis-4-cyclohexene-1,2-dicarboxylate group at the side chain, a styrene-maleic anhydride copolymer, a crotonic acid vinyl acetate copolymer, an acidic cellulose derivative, polyvinylpyridine, a xylene resin, glue, casein, gum arabic, egg albumen, a vinyl monomer graft polymer of polyvinyl alcohol, a novolak type metacresol resin, an acryloylglycin-vinyl acetate copolymer, styrene-butadiene rubber, an epoxy resin, polyacrylamide, a copolymer of acrylamide, a polyurethane resin, polystyrene, etc.

Furthermore, polymers reactive with a decomposate of azido groups to be formed upon exposure to light can contain any polymer reactive with nitrene, since nitrene is formed by the decomposition of the azido group upon exposure to light. Polymers having a C—H bond or a C=C bond are preferred, since nitrene causes a replacement reaction or a dehydrogenation with the C—H bond, an addition with double bond, an oxidation addition with phenols, etc.

Mixtures of compounds having a light-sensitive azido group and polymers reactive with a decomposate of azido groups to be formed upon exposure to light useful in this invention are described, e.g., in Japanese Patent Application (OPI) Nos. 32923/75 (the term "OPI" as used herein refers to a "published unexamined Japanese patent application") and 32924/75, Japanese Patent Publication Nos. 10725/75 and 11285/75, and Japanese Patent Application (OPI) Nos. 134656/77 and 10648/78.

The mixing ratios of the compound having a light-sensitive azido group and a polymer reactive with a decomposate of azido groups to be formed upon exposure to light in the mixture used in this invention are from 1 to 30% by weight for the azido compound and from 99 to 70% by weight for the polymer.

The light-sensitive composition of this invention is generally used in a manner wherein a mixture of the light-sensitive resist-forming compound, i.e., the photo-crosslinkable polymer, or the compound having a light-sensitive azido group and a polymer reactive with a decomposate of azido groups to be formed upon exposure to light, is dissolved in a solvent together with the aforesaid sensitizer and, if necessary, a plasticizer, a binder, and a dye or pigment and the solution is coated on a suitable support by a known method.

Examples of useful plasticizer include phthalic acid esters such as dimethyl phthalate, diethyl phthalate, dibutyl phthalate, dihexyl phthalate, dichlorohexyl phthalate, ditridecyl phthalate, etc.; glycol esters such as dimethyl glycol phthalate, ethylphthalylethyl glycol, butylphthalylbutyl glycol, etc.; phosphoric acid esters such as tricresyl phosphate, triphenyl phosphate, etc.;

and aliphatic dibasic acid esters such as diisobutyl adipate, dioctyl adipate, dibutyl sebacate, dibutyl maleate, etc.

The binder may be selected, e.g., from organic high molecular weight polymers soluble in coating solvents. As such a high molecular weight polymer, there are polyvinyl acetate, polyvinyl alcohol, polyvinyl pyrrolidone, polyacrylonitrile, a copolymer of acrylonitrile and styrene, an interpolymer of acrylonitrile, butadiene and styrene, polyethylene, polypropylene, polystyrene, poly-α-methylstyrene, polyamide (e.g., 6-nylon, 6,6-nylon, etc.), poly(1,3-butadiene), polyisoprene, cyclized rubber, ethyl cellulose, acetyl cellulose, polyvinyl butyral, a novolak type phenol resin, a novolak type denatured phenol resin, etc.

Examples of the dye or pigment include, for example, Methylene Blue, Crystal Violet, Rhodamine B, Fuchsine, Auramine, azoic dyes, anthraquinonic dyes, titanium oxide, carbon black, iron oxide, phthalocyanine pigments, azoic pigments, etc.

The preferred ratios of the component and additives per 100 parts by weight of the light-sensitive resist-forming compound are shown below in parts by weight.

|  | Preferred Range (wt. parts) | Particularly Preferred Range (wt. parts) |
| --- | --- | --- |
| Sensitizer | 0.1–100 | 0.1–50 |
| Plasticizer | 0–1,000 | 0–500 |
| Binder | 0–5,000 | 0–1,000 |
| Dye or Pigment | 0–100 | 0–50 |

Examples of solvents useful for coating the light-sensitive composition of this invention include ethylene dichloride, cyclohexanone, methyl ethyl ketone, methyl cellosolve acetate, monochlorobenzene, toluene, ethyl acetate, etc. These solvents may be used solely or as a mixture thereof.

In the case of producing light-sensitive lithographic printing plates, the coverage of the light-sensitive composition of this invention in referring the printing plate precursor is preferably from 0.1 to 10.0 g/m$^2$, and more preferably from 0.5 to 5.0 g/m$^2$ (as solid components).

The light-sensitive composition of this invention is suitable as a light-sensitive layer of light-sensitive lithographic printing plates. Examples of supports suitable for such a light-sensitive lithographic printing plate include aluminum plates treated to render them hydrophilic, for example, silicate-treated aluminum plates, anodized aluminum plates, sand-grained aluminum plates, silicate-electrodeposited aluminum plates, etc., as well as zinc plates, stainless steel plates, chrome-treated copper plates, and plastic films or papers treated for rendering hydrophilic.

The light-sensitive composition of this invention can also be used for producing films for photomask, and examples of supports used in this case include polyethylene terephthalate film having vapor-deposited thereon aluminum, an aluminum alloy, or chromium, and polyethylene terephthalate films having colored layers formed thereon.

The light-sensitive composition of this invention can be further used for photoresist and in this case, various supports such as copper plates, copper-plated plates, stainless steel plates, glass sheets, etc.

The invention is explained in more detail by the following examples, but the invention is not to be considered limited thereby.

Examples of producing the typical sensitizers of this invention shown by the formula (I) are shown by following preparative examples 1 to 5 and it will be understood that all the compounds (No. 1 to No. 20) illustrated above may be also produced according to one of the production examples shown below.

PREPARATIVE EXAMPLE 1

Production of 3-ethyl-5-(3-ethylbenzoxazolylidene)rhodanine (Sensitizer No. 1)

A mixture of 3.0 g of 2-mercaptobenzoxazole and 12.0 g of ethyl p-toluenesulfonate was heated to 150° C. to react them for 6 hours. The reaction product was cooled to 80° C., and 25 ml of ethanol was added to it, thereby producing an ethanol solution of 2-ethylmercapto-3-ethylbenzoxazolium-p-toluenesulfonate.

After adding 4.8 g of 2-ethyl rhodanine to the solution, 6.0 g of triethylamine was added dropwise to the solution over a 3 minute period with stirring at room temperature (about 20° C.) and thereafter, the resultant mixture was refluxed for 10 minutes. After cooling the reaction mixture, precipitates formed were recovered by filtration and recrystallized from ethanol to provide 4.0 g of 3-ethyl-5-(3-ethylbenzoxazolylidene)rhodanine (melting point 165° to 166° C.).

PREPARATIVE EXAMPLE 2

Production of 3-ethyl-5-(3-ethylbenzothiazolylidene)rhodanine (Sensitizer No. 6)

A mixture of 3.3 g of 2-mercaptobenzothiazole and 10.0 g of ethyl p-toluenesulfonate was heated to 150° C. to react them for 6 hours. The reaction product was cooled to 80° C. and then 30 ml of ethanol was added to it, thereby producing an ethanol solution of 2-ethylmercapto-3-ethylbenzothiazolium p-toluenesulfonate.

After adding 3.2 g of 3-ethylrhodanine to the solution, 6.1 g of triethylamine was added dropwise to the solution over a 3 minute period with stirring at room temperature (about 20° C.) and thereafter the resultant mixture was refluxed for 10 minutes. After cooling the reaction mixture, precipitates formed were recovered by filtration and recrystallized from a mixture of chloroform and ethanol to provide 4.5 g of 3-ethyl-5-(3-ethylbenzothiazolylidene)rhodanine (melting point 246° to 248° C.).

PREPARATIVE EXAMPLE 3

Production of 3-carboethoxymethyl-5-(3-ethylbenzothiazolylidene)rhodanine (Sensitizer No. 8)

To 30 ml of an ethanol solution of 13.0 g of the intermediate product obtained in Preparative Example 2, viz., 2-ethylmercapto-3-ethylbenzothiazolium p-toluenesulfonate, was added 4.4 g of 3-carboethoxymethylrhodanine, while stirring the mixture at room temperature (about 20° C.), 6.1 g of triethylamine was added dropwise to the solution over a 3 minute period, and thereafter the resultant mixture was refluxed for 10 minutes. After cooling the reaction mixture, precipitates formed were recovered by filtration and recrystallized from a mixture of chloroform and ethanol to provide 1.1 g of 3-carboethoxymethyl-5-(3-ethylbenzothiazolylidene)rhodanine (melting point 250° to 252° C.).

PREPARATIVE EXAMPLE 4

Production of
3-benzyl-5-(3-ethylbenzothiazolylidene)rhodanine
(Sensitizer No. 9)

To 30 ml of an ethanol solution of 13.0 g of the intermediate product obtained in Preparative Example 2, viz., 2-ethylmercapto-3-ethylbenzothiazolium p-toluenesulfoante, was added 4.5 g of 3-benzylrhodanine, while stirring the mixture at room temperature (about 20° C.), 6.1 g of triethylamine was added dropwise to the mixture over a 3 minute period, and thereafter, the resultant mixture was refluxed for 10 minutes. After cooling the reaction mixture, precipitate formed was recovered by filtration and recrystallized from a mixture of chloroform and ethanol to provide 4.6 g of 3-benzyl-5-(3-ethylbenzothiazolylidene)rhodanine (melting point 209° to 211° C.).

PREPARATIVE EXAMPLE 5

Production of
5-(3-ethylbenzothiazolylidene)-1,3-oxazoline-2-thion-4-one (Sensitizer No. 13)

To 30 ml of an ethanol solution of 13.0 g of the intermediate product obtained in Preparative Example 2, viz., 2-ethylmercapto-3-ethylbenzothiazolium-p-toluenesulfonate, was added 2.3 g of 1,3-oxazoline-3-thion-4-one, while stirring the mixture at room temperature (about 20° C.), 6.1 g of triethylamine was added dropwise to the mixture over a 3 minute period, and thereafter, the resultant mixture was refluxed for 10 minutes. After cooling the reaction mixture, precipitate formed was recovered by filtration and recrystallized from acetonitrile to provide 2.5 g of 5-(3-ethylbenzothiazolylidene)-1,3-oxazoline-2-thion-4-one (melting point 217° to 218° C.).

Next, examples according to this invention are shown below.

EXAMPLE 1

A light-sensitive lithographic printing plate was prepared by coating a 0.24 mm-chick aluminum plate the surface of which had been sand-grained and anodized with a light-sensitive solution having a composition as shown below using a whirler and drying it for 2 minutes at 100° C.

| | |
|---|---|
| Polyester prepared by condensing ethyl p-phenylenediacrylate and an equimolar amount of 1,4-β-hydroxyethoxycyclohexane | 0.5 G |
| Sensitizer (see, Table 1) | 0.03 g |
| Dihexyl Phthalate | 0.05 g |
| Copper Phthalocyanine | 0.05 g |
| Monochlorobenzene | 9 g |
| Ethylene Dichloride | 6 g |

The coverage thereof after drying was 1.2 g/m².

The dried light-sensitive lithographic printing plate was immediately placed on a stand with the light-sensitive layer directed upwards. A paper was placed on the whole surface of the light-sensitive layer, a load was applied uniformly on the whole surface of the paper, and the assembly was allowed to stand for 1 week at room temperature (about 15° C. to 30° C.). Thereafter, the paper was removed and the state of the light-sensitive layer was observed (by the naked eye). The results are shown in Table 1. Also, the result obtained in the case of using 2-benzoylmethylene-3-methyl[1,2-d]naphthothiazoline (BNTZ) is shown in Table 1 as a comparison example 1.

TABLE 1

| Compatibility Test of Light-Sensitive Printing Plate | | |
|---|---|---|
| Experiment No. | Sensitizer of Formula (I) | State of Light-Sensitive Layer after 1 Week |
| 1 | No. 1 | good |
| 2 | No. 2 | good |
| 3 | No. 3 | good |
| 4 | No. 4 | good |
| 5 | No. 7 | good |
| 6 | No. 8 | good |
| 7 | No. 9 | good |
| 8 | No. 12 | good |
| 9 | No. 13 | good |
| 10 | No. 18 | good |
| Comparison Example 1 | BNTZ | crystals partially crystallized |

When the sensitizer, BNTZ was used in Comparison Example 1, a part of the sensitizer was crystallized and precipitated in the light-sensitive layer, but in cases using the sensitizers of this invention, the sensitizers were not crystallized and precipitated in the light-sensitive layers, and, as shown in Table 1, the light-sensitive layers retained good surface states. Thus, the desired effect of this invention was obtained.

EXAMPLE 2

A step wedge (density step difference 0.15; density step number 0 to 15 steps) was placed on a light-sensitive printing plate prepared as in Example 1 and after exposing the light-sensitive printing plate for 60 seconds at 25° C. using a jet printer (Type HMW-69F1, made by Oak Seisakusho), the plate was developed with a developer having the following composition.

| Developer | |
|---|---|
| 4-Butyrolactone | 1,000.0 ml |
| Triethanolamine | 100.0 ml |
| Glycerol | 100.0 ml |
| Methyl Abietate | 10.0 ml |
| Hydrogenated Wood Resin | 1.0 g |
| Wetting Agent | 9.0 ml |
| Lactic Acid (70%) | 31.0 ml |

Then, the highest step number of the step wedge corresponding to image formation was noted, as shown in Table 2, as a sensitivity of each sample. Thus, the higher the step number, the higher the sensitivity indicated. Also, the same experiment was repeated on the case of using 2-benzoylmethylene-3-methyl[1,2-d]naphthothiazoline (BNTZ) as a sensitizer (Comparison Example 2) and the case of using no sensitizer (Comparison Example 3), and the results of these experiments are also shown in Table 2.

TABLE 2

| Sensitivity of Light-Sensitive Printing Plate | | |
|---|---|---|
| Experiment No. | Sensitizer of Formula (I) | Highest Step No. of Step Wedge |
| 11 | No. 1 | 10 |
| 12 | No. 2 | 10 |
| 13 | No. 3 | 11 |
| 14 | No. 4 | 11 |
| 15 | No. 7 | 11 |

TABLE 2-continued

| Sensitivity of Light-Sensitive Printing Plate | | |
|---|---|---|
| Experiment No. | Sensitizer of Formula (I) | Highest Step No. of Step Wedge |
| 16 | No. 8 | 11 |
| 17 | No. 9 | 11 |
| 18 | No. 12 | 11 |
| 19 | No. 13 | 10 |
| 20 | No. 18 | 11 |
| Comparison Example 2 | BNTZ | 10 |
| Comparison Example 3 | none | 0 |

As is shown in Table 2 the cases of using the sensitizers of this invention showed very high sensitivity as compared with the cases of using no sensitizer, and the sensitivity of the former case was the same as or higher than in the case of using BNTZ.

EXAMPLE 3

A light-sensitive lithographic printing plate was prepared by coating the aluminum plate as in Example 1 with the light-sensitive solution having the below-showing composition using a whirler and drying it for 5 minutes at 80° C.

| | |
|---|---|
| Cinnamic Acid Ester of Polyvinyl Alcohol | 0.4 g |
| Sensitizer (see, Table 3) | 0.03 g |
| Cyclohexane | 10 ml |
| Toluene | 1 ml |

A step wedge (density step difference 0.15; density step number 0 to 15 steps) was placed on the light-sensitive printing plate as in Example 2 and after exposing the light-sensitive plate for 120 seconds using the aforesaid jet printer, the plate was developed for 60 seconds at 25° C. with cyclohexanone. The highest step number of the step wedge corresponding the image formed was shown in Table 3 as the sensitivity of each sample. Also, the sensitivity of the case using no sensitizer (Comparison Example 4) was shown in Table 3.

TABLE 3

| Sensitivity of Light-Sensitive Printing Plate | | |
|---|---|---|
| Experiment No. | Sensitizer of Formula (I) | Highest Step No. of Step Wedge |
| 21 | No. 4 | 9.0 |
| 22 | No. 5 | 10.0 |
| 23 | No. 6 | 8.0 |
| 24 | No. 7 | 9.0 |
| 25 | No. 12 | 7.0 |
| 26 | No. 13 | 7.5 |
| 27 | No. 14 | 7.0 |
| Comparison Example 4 | none | 0 |

As is shown in Table 3, the cases of using the sensitizers of this invention showed very high sensitivity as compared with using no sensitizer.

EXAMPLE 4

A light-sensitive lithographic printing plate was prepared by coating the aluminum plate as in Example 1 with the light-sensitive solution having the following composition using a whirler and drying it for 5 minutes at 80° C.

| | |
|---|---|
| 2,6-Di(4'-azidobenzal)-4-methyl-cyclohexanone | 0.4 g |
| Polymer prepared by the reaction of a copolymer of n-butyl methacrylate and 2-hydroxyethyl methacrylate (6:4 in mole ratio) and tetra-hydrophthalic anhydride | 3.0 g |
| Sensitizer (see, Table 4) | 0.3 g |
| Methyl Cellosolve | 60 ml |
| Cyclohexanone | 60 ml |

A step wedge was placed in the light-sensitive printing plate as in Example 2, and after exposing the light-sensitive plate for 120 seconds using the aforesaid jet printer, the plate was developed for 60 seconds at 25° C. with cyclohexanone. The highest step number of the step wedge corresponding to the image formed is shown in Table 4 and is indicative of the sensitivity of samples. Also, the same test was repeated in the case of using 2-benzoylmethylene-3-methyl[1,2-d]naphthothiazoline (BNTZ) as a sensitizer (Comparison Example 5) and the case of using no sensitizer (Comparison Example 6), and the results are also shown in Table 4.

TABLE 4

| Sensitivity of Light-Sensitive Printing Plate | | |
|---|---|---|
| Experiment No. | Sensitizer of Formula (I) | Highest Step No. of Step Wedge |
| 28 | No. 4 | 5.0 |
| 29 | No. 5 | 5.5 |
| 30 | No. 6 | 3.5 |
| 31 | No. 7 | 4.0 |
| 32 | No. 12 | 4.0 |
| 33 | No. 13 | 4.0 |
| 34 | No. 14 | 4.0 |
| Comparison Example 5 | BNTZ | 2.5 |
| Comparison Example 6 | none | 0.5 |

As is shown in Table 4, in the cases of using the sensitizers of this invention they showed step numbers from 3.5 to 5.0 in the step wedge, that is, the sensitivities are from 2.8 to 5.6 times higher than in the case of using no sensitizer, and also show higher sensitivity than the case of using BNTZ.

EXAMPLE 5

A light-sensitive lithographic printing plate was prepared by coating the aluminum plate as in Example 1 with a light-sensitive solution having the following composition using a whirler and drying it for 2 minutes at 100° C.

| | |
|---|---|
| Light-sensitive compound prepared by acetalizing polyvinyl alcohol with p-azidobenzaldehyde | 0.4 g |
| Sensitizer (see, Table 5) | 0.03 g |
| Dihexyl Phthalate | 0.1 g |
| Ethyl Cellosolve | 13 ml |

A step wedge was placed on the light-sensitive printing plate thus prepared as in Example 2 and after exposing the light-sensitive plate for 120 seconds using the aforesaid jet printer, the plate was developed for 60 seconds at 25° C. with ethyl cellosolve. The highest step number of the step wedge corresponding to the image formed was shown in Table 5 as the sensitivity of each sample. The higher the step number, the higher the sensitivity. Also, the same test was repeated on the case of using no sensitizer (Comparison Example 7) and the result was also shown in Table 5.

TABLE 5

Sensitivity of Light-Sensitive Printing Plate

| Experiment No. | Sensitizer of Formula (I) | Highest Step No. of Step Wedge |
|---|---|---|
| 35 | No. 5 | 5 |
| 36 | No. 6 | 4 |
| 37 | No. 7 | 5 |
| 38 | No. 12 | 5 |
| 39 | No. 13 | 4 |
| Comparison Example 7 | none | 0 |

EXAMPLE 6

A light-sensitive lithographic printing plate was prepared by coating the aluminum plate as in Example 1 with the light-sensitive solution having the following composition using a whirler and drying it for 5 minutes at 80° C.

| Poly[1,4-cyclohexylene-bis-(oxyethylene)-p-phenylenediacrylate-co-3,3'-(sodio-iminodisulfonyl)-benzoate] | 0.5 g |
|---|---|
| Dihexyl Phthalate | 0.1 g |
| Sensitizer (see, Table 6) | 0.03 g |
| Toluene | 4 ml |
| Methyl Cellosolve Acetate | 8 ml |

A step wedge was placed on the light-sensitive printing plate thus prepared as in Example 2 and after exposing the light-sensitive plate using the aforesaid jet printer, the plate was developed for 60 seconds at 25° C. with the developer used in Example 2. The highest step numbers of the step wedge corresponding to the image formed are shown in Table 6 as the sensitivity of each sample. Also, the same test was repeated in the case of using 2-benzoylmethylene-3-methyl[1,2-d]naphthothiazoline (BNTZ) as a sensitizer (Comparison Example 8) and the case of using no sensitizer (Comparison Example 9) and the results are also shown in Table 6.

TABLE 6

Sensitivity of Light-Sensitive Printing Plate

| Experiment No. | Sensitizer of Formula (I) | Highest Step No. of Step Wedge |
|---|---|---|
| 40 | No. 5 | 9.5 |
| 41 | No. 6 | 9.5 |
| 42 | No. 12 | 9.0 |
| 43 | No. 14 | 8.5 |
| Comparison Example 8 | BNTZ | 8.5 |
| Comparison Example 9 | none | 0 |

While the invention has been described in detail and with reference to specific embodiments thereof, it will be apparent to one skilled in the art that various changes and modifications can be made therein without departing from the spirit and scope thereof.

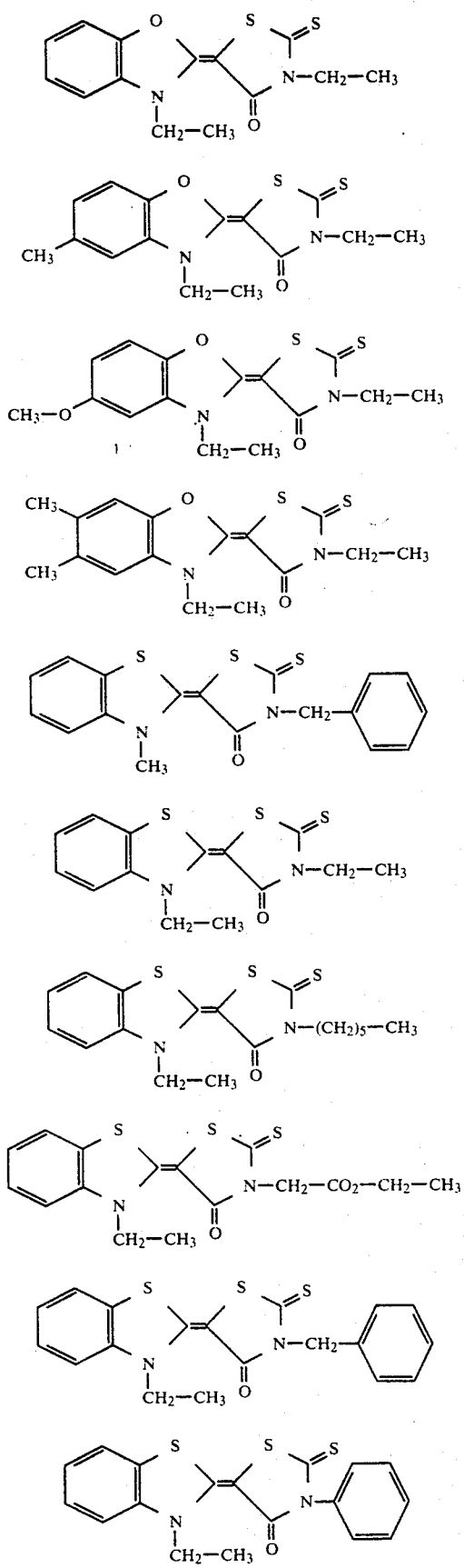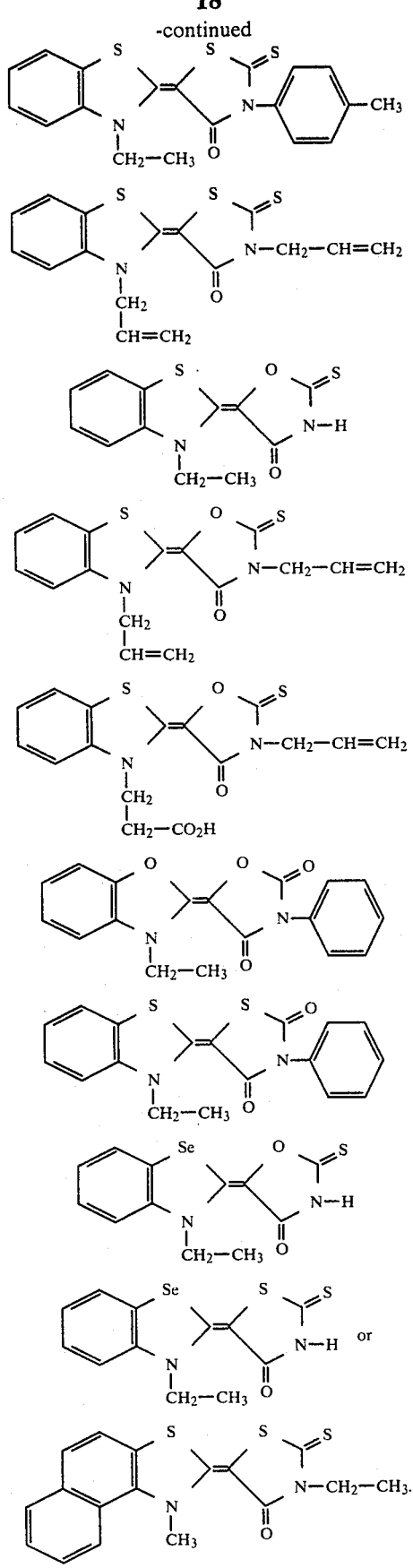

What is claimed is:

1. A light-sensitive composition consisting essentially of a mixture of a sensitizer and a photo-crosslinkable polymer selected from polymers having a polymerization unit having bonded thereto an R—CH=CH—CO— group, wherein R is an aryl group or a heterocyclic group, or polyesters having a —CH=CH—CO— group in their main polymer chain, or a mixture of a sensitizer, a compound including a light-sensitive azido group and a polymer reactive with a decomposition product of azido groups to be formed upon exposure to light, said sensitizer comprising the compound represented by the formula (I)

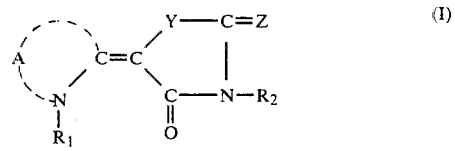

wherein A represents a non-metallic group necessary for forming a heterocyclic ring containing nitrogen; $R_1$ represents an alkyl group or a substituted alkyl group; $R_2$ represents hydrogen, an alkyl group, a substituted alkyl group, an aryl group or a substituted aryl group; and Y and Z each represents an oxygen atom or a sulfur atom.

2. A light-sensitive composition as in claim 1 consisting essentially of a photo-crosslinkable polymer and a sensitizer represented by formula (I).

3. A light-sensitive composition as in claim 1 consisting essentially of a mixture of a compound including a light-sensitive azido group, a polymer reactive with a decomposate of azido groups to be formed upon exposure to light, and a sensitizer represented by the formula (I).

4. A light-sensitive composition as in claim 1, 2, or 3 wherein A in formula (I) represents the non-metallic group necessary for forming a heterocyclic ring selected from benzothiazole, naphthothiazole, benzoselenazole, naphthoselenazole, benzoxazole, and naphthoxazole rings.

5. A light-sensitive composition as in claim 1, 2, or 3 wherein $R_1$ is an alkyl group or a substituted alkyl group having from 1 to 6 carbon atoms.

6. A light-sensitive composition as in claim 1, 2, or 3 wherein $R_2$ is an alkyl group or a substituted alkyl group having from 1 to 16 carbon atoms or an aryl group or a substituted aryl group.

7. A light-sensitive composition as in claim 3 wherein the composition comprises from 1 to 30% by weight the compound including a light-sensitive azido group and from 99 to 70% by weight of the polymer reacted with a decomposite product of azido groups to be formed upon exposure to light.

8. A light-sensitive composition as in claim 2, wherein said photo-crosslinkable polymer is selected from the group consisting of a cinnamic acid ester of polyvinyl alcohol, starch, cellulose, hydroxyalkylcellulose or partially alkylated polyvinyl alcohol wherein said cinnamic acid is cinnamic acid, α-phenylcinnamic acid, o-chlorocinnamic acid or m-nitro cinnamic acid, cinnamoylated polystyrene, a β-(2-furyl)acrylic acid ester of polyvinyl alcohol and a polyester prepared by condensing ethyl p-phenylene diacrylate and 1,4-β-hydroxyethoxy cyclohexane.

9. A light-sensitive composition as claimed in claim 1, wherein said sensitizer represented by the general formula (I) is